United States Patent
Hill

(10) Patent No.: US 6,795,197 B2
(45) Date of Patent: Sep. 21, 2004

(54) INTERFEROMETER SYSTEM AND LITOGRAPHIC STEP-AND-SCAN APPARATUS PROVIDED WITH SUCH A SYSTEM

(75) Inventor: Henry Allen Hill, Tucson, AZ (US)

(73) Assignee: Zygo Corporation, Middlefield, CT (US)

(*) Notice: Subject to any disclaimer, the term of this patent is extended or adjusted under 35 U.S.C. 154(b) by 189 days.

(21) Appl. No.: 10/175,166

(22) Filed: Jun. 19, 2002

(65) Prior Publication Data

US 2002/0196448 A1 Dec. 26, 2002

Related U.S. Application Data

(60) Provisional application No. 60/299,982, filed on Jun. 21, 2001.

(51) Int. Cl.[7] .................................................. G01B 9/02
(52) U.S. Cl. ...................................................... 356/486
(58) Field of Search ............................... 356/28.5, 485, 356/486, 500, 508, 509

(56) References Cited

U.S. PATENT DOCUMENTS

| | | | |
|---|---|---|---|
| 6,046,792 A | | 4/2000 | Van Der Werf et al. |
| 6,211,965 B1 | * | 4/2001 | Tsuchiya et al. ............ 356/493 |
| 6,404,505 B2 | * | 6/2002 | Matsui ........................ 356/620 |

FOREIGN PATENT DOCUMENTS

| WO | WO 00/66969 | 11/2000 |
|---|---|---|

OTHER PUBLICATIONS

Zanoni, C. "Differential Interferometer Arrangements for Distance and Angle Measurements: Principles, Advantages, and Applications." VDI Berichte NR. 749, (1989).

* cited by examiner

Primary Examiner—Samuel A. Turner
Assistant Examiner—Michael A. Lyons
(74) Attorney, Agent, or Firm—Francis J. Caufield

(57) ABSTRACT

Interferometric apparatus and methodology for monitoring the relative motion among objects, preferably that of mask and wafer stages in photolithographic processes. The apparatus comprises a plurality of interferometers with each operating to provide a mixed optical interference signal containing phase information indicative of the motion of a corresponding object. Electrical interference signals are generated from the optical interference signals, and one of these is modified to compensate for any Doppler shift differences among the electrical interference signals caused by differences in preferred relative rates of motion in the objects. A mixer receives the electrical interference signals and the modified electrical interference signal and generates an output electrical interference signal containing information about the relative motion between objects. In another aspect of the invention the plurality of interferometers are configured to optically compensate for any Doppler shift differences among the mixed optical interference signals.

16 Claims, 3 Drawing Sheets

INTERFEROMETER SYSTEM AND LITOGRAPHIC STEP-AND-SCAN APPARATUS PROVIDED WITH SUCH A SYSTEM

CROSS REFERENCE TO RELATED APPLICATION

This application claims benefit from United States Provisional Patent Application No. 60/299,982 filed on Jun. 21, 2001, the entire contents of which are incorporated herein by reference.

BACKGROUND OF THE INVENTION

This invention in general relates to interferometry and in particular to interferometric apparatus and methods by which reticle and wafer stage slew rates of photolithographic apparatus may be increased while minimizing any deleterious Doppler shift frequency signal processing problems.

Interferometry is a well established metrology used extensively in microfabrication processes to measure and control a host of critical dimensions. It is especially important in manufacturing semiconductors and the like where requirements for precision are 10 to 40% better than critical dimensions of 0.1 $\mu$m or below.

Integrated circuits made of semiconductor materials are constructed by successively depositing and patterning layers of different materials on a silicon wafer while it typically resides in a flat exposure plane having Cartesian x-y coordinates to which there is a normal z-direction. The patterning process consists of a combination of exposure and development of photoresist followed by etching and doping of the underlying layers and deposition of another layer. This process results in a complex and, on the scale of microns, very nonhomogeneous material structure on the wafer surface.

Typically, each wafer contains multiple copies of the same pattern called "fields" arrayed on the wafer in a nominally rectilinear distribution known as the "grid." Often, but not always, each field corresponds to a single "chip."

The exposure process consists of projecting the image of the next layer pattern onto (and into) the photoresist that has been spun onto the wafer. For the integrated circuit to function properly each successive projected image must be accurately matched to the patterns already on the wafer. The process of determining the position, orientation, and distortion of the patterns already on the wafer, and then placing them in the correct relation to the projected image, is termed "alignment." The actual outcome, i.e., how accurately each successive patterned layer is matched to the previous layers, is termed "overlay."

In general, the alignment process requires both translational and rotational positioning of the wafer and/or the projected image as well as some distortion of the image to match the actual shape of the patterns already present. The fact that the wafer and the image need to be positioned correctly to get one pattern on top of the other is obvious. Actual distortion of the image is often needed as well. Other effects, such as thermal and vibration, may require compensation as well.

The net consequence of all this is that the shape of the first-level pattern printed on the wafer is not ideal and all subsequent patterns must, to the extent possible, be adjusted to fit the overall shape of the first-level printed pattern. Different exposure tools have different capabilities to account for these effects, but, in general, the distortions or shape variations that can be accounted for include x and y magnification and skew. These distortions, when combined with translation and rotation, make up the complete set of linear transformations in the plane.

Since the problem is to successively match the projected image to the patterns already on the wafer, and not simply to position the wafer itself, the exposure tool must effectively be able to detect or infer the relative position, orientation, and distortion of both the wafer patterns themselves and the projected image.

It is difficult to directly sense circuit patterns themselves, and therefore, alignment is accomplished by adding fiducial marks or "alignment marks" to the circuit patterns. These alignment marks can be used to determine the reticle position, orientation, and distortion and/or the projected image position, orientation, and distortion. They can also be printed on the wafer along with the circuit pattern and hence can be used to determine the wafer pattern position, orientation, and distortion. Alignment marks generally consist of one or more clear or opaque lines on the reticle, which then become "trenches" or "mesas" when printed on the wafer. But more complex structures such as gratings, which are simply periodic arrays of trenches and/or mesas, and checkerboard patterns are also used. Alignment marks are usually located either along the edges of "kerf" of each field or a few "master marks" are distributed across the wafer. Although alignment marks are necessary, they are not part of the chip circuitry and therefore, from the chip maker's point of view, they waste valuable wafer area or "real estate." This drives alignment marks to be as small as possible, and they are often less than a few hundred micrometers on a side.

Alignment sensors are incorporated into the exposure tool to "see" alignment marks. Generally there are separate sensors for the wafer, the reticle, and/or the projected image itself. Depending on the overall alignment strategy, these sensors may be entirety separate systems or they may be effectively combined into a single sensor. For example, a sensor that can see the projected image directly would nominally be "blind" with respect to wafer marks and hence a separate wafer sensor is required. But a sensor that "looks" at the wafer through the reticle alignment marks themselves is essentially performing reticle and wafer alignment simultaneously and hence no separate reticle sensor is necessary. Note that in this case the positions of the alignment marks in the projected image are being inferred from the positions of the reticle alignment marks and a careful calibration of reticle to image positions must have been performed before the alignment step.

Furthermore, as implied above, essentially all exposure tools use sensors that detect the wafer alignment marks optically. That is, the sensors project light at one or more wavelengths onto the wafer and detect the scattering/diffraction from the alignment marks as a function of position in the wafer plane. Many types of alignment sensor are in common use and their optical configurations cover the full spectrum from simple microscopes to heterodyne grating interferometers. Also, since different sensor configurations operate better or worse on given wafer types, most exposure tools carry more than one sensor configuration to allow for good overlay on the widest possible range of wafer types.

The overall job of an alignment sensor is to determine the position of each of a given subset of all the alignment marks on a wafer in a coordinate system fixed with respect to the exposure tool. These position data are then used in either of two generic ways, termed "global" and "field-by-field," to perform alignment. In global alignment the marks in only a few fields are located by the alignment sensor(s) and the data are combined in a best-fit sense to determine the optimum alignment of all the fields on the wafer. In field-by-field alignment the data collected from a single field are used to align only that field. Global alignment is usually both faster, because not all the fields on the wafer are located, and less sensitive to noise, because it combines all the data together to find a best overall fit. But, since the results of the best fit are used in a feed-forward or dead reckoning approach, it does rely on the overall optomechanical stability of the exposure tool.

Alignment is generally implemented as a two-step process; that is, a fine alignment step with an accuracy of tens of nanometers follows an initial coarse alignment step with an accuracy of microns, and alignment requires positioning the wafer in all six degrees of freedom: three translation and three rotation. But adjusting the wafer so that it lies in the projected image plane, i.e., leveling and focusing the wafer, which involves one translational degree of freedom (motion along the optic axis, the z-axis or a parallel normal to the x-y wafer orientation) and two rotational degrees of freedom (orienting the plane of the wafer to be parallel to the projected image plane), is generally considered separate from alignment. Only in-plane translation (two degrees of freedom) and rotation about the projection optic axis (one degree of freedom) are commonly meant when referring to alignment. The reason for this separation in nomenclature is the difference in accuracy required. The accuracy required for in-plane translation and rotation generally needs to be on the order of several tens of nanometers or about 20 to 30% of the minimum feature size or critical dimension (CD) to be printed on the wafer. Current state-of-the-art CD values are on the order of several hundred nanometers and thus the required alignment accuracy is less than 100 nm. On the other hand, the accuracy required for out-of-plane translation and rotation is related to the total usable depth of focus of the exposure tool, which is generally close to the CD value. Thus out-of-plane focusing and leveling the wafer require less accuracy than in-plane alignment. Also, the sensors for focusing and leveling are usually completely separate from the "alignment sensors" and focusing and leveling do not usually rely on patterns on the wafer. Only the wafer surface or its surrogate needs to be sensed. Nevertheless, this is still a substantial task requiring among other things precise knowledge about the vertical position (the altitude) of the optical projection system above the wafer.

Thus, to achieve precision alignment, interferometric techniques are used for positioning both the reticle (mask) and wafer stages that in general want to operate at different slew rates owing to the differences in scale between the physical dimensions of the reticle and its image as projected onto the wafer. Because there is typically a 4 or 5 to 1 reduction in scale, the reticle stage desirably should be operated at speeds 4 to 5 times faster than that of the wafer and still maintain precision requirements.

The precision with which interferometers can provide such position control has been significantly enhanced by technical advances in the design of various optical components, including lasers, and photosensors. However, the performance of interferometers, and thus the operating slew rates of photolithographic stages is, nevertheless, limited by certain system parameters such as the split frequency between the input reference and measurement beam components available through commonly available laser sources used in dispersion interferometry and heterodyne signal processing applications.

Accordingly, it is a major object of the present invention to provide interferometric apparatus by which the operating slew rates of photolithographic stages may be increased.

It is another object of the present invention to provide interferometric apparatus and apparatus by which the effect of Doppler shifts can be reduced while a high sensitivity to a difference in relative Doppler shifts is maintained when monitoring relative speeds between reticle and wafer stages.

Other objects of the present invention will, in part, be obvious and will, in part, appear hereinafter when reading the following detailed description in conjunction with the drawings.

SUMMARY OF THE INVENTION

Interferometric apparatus and methodology for monitoring the relative motion among objects, preferably that of mask and wafer stages in photolithographic processes. The apparatus comprises a plurality of interferometers where each interferometer operates to provide a mixed optical interference signal containing phase information indicative of the motion of a corresponding object. Detector means are provided for receiving the mixed optical interference signals and generating electrical interference signals containing information corresponding to the motion of an associated object. Electronic processing means operate to receive at least one select one of the electrical interference signals and generate a corresponding modified electrical interference signal that is compensated for any Doppler shift differences among the electrical interference signals caused by differences in the relative rates of motion in the objects. Electronic mixing means are provided for receiving the electrical interference signals and the modified electrical interference signal and generating an output electrical interference signal containing information about the relative motion between objects.

In another aspect of the invention each of the plurality of interferometers has a measurement beam that travels over a predetermined optical path and operates to provide a mixed optical interference signal containing phase information indicative of the motion of a corresponding object where the measurement beam of at least one of the interferometers travels over its corresponding predetermined optical path a different number of passes than that traveled by the measurement beams of the other interferometers to compensate for any Doppler shift differences among the mixed optical interference signals caused by differences in the relative rates of motion between the objects.

BRIEF DESCRIPTION OF THE DRAWINGS

The structure, operation, and methodology of the invention, together with other objects and advantages thereof, may best be understood by reading the detailed description in connection with the drawings in which each part has an assigned numeral that identifies it wherever it appears in the various drawings and wherein.

DETAILED DESCRIPTION

This invention in general relates to interferometry and in particular to interferometric apparatus and methods by which slew rates of photolithographic stages may increased and by which the relative motions of reticle and wafer stages may be controlled.

Figure 1:
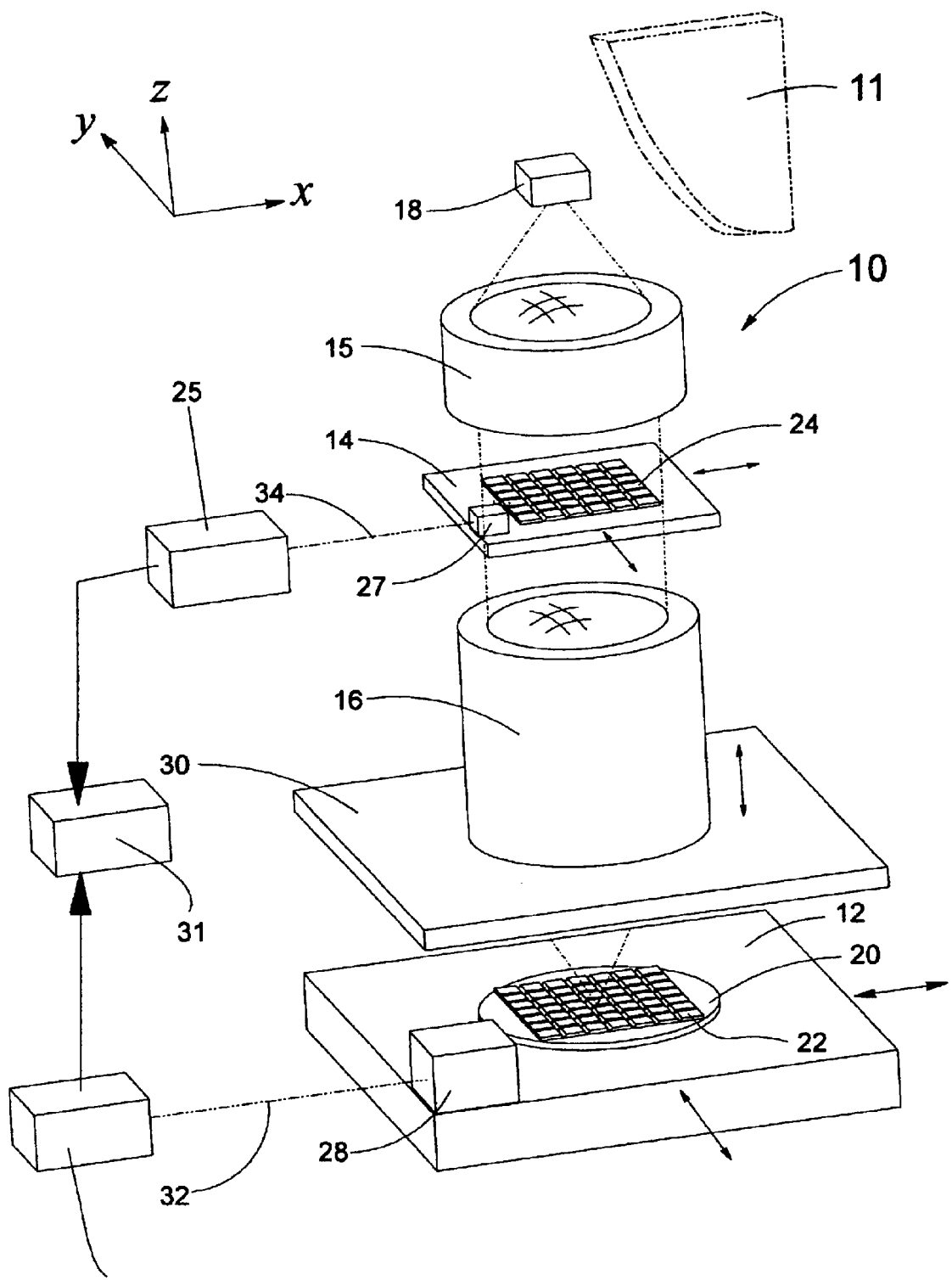
FIG. 1 is a highly diagrammatic perspective view of a photolithographic stepper or scanning system In which the invention may be incorporated for the control of the relative slew rates of the reticle and wafer stages.

As is well-known, optical lithography involves the creation of relief image patterns through the projection of radiation within or near the ultraviolet (UV)-visible portion of the electromagnetic spectrum and has been extensively used in the making of microcircuit patterns for semiconductor devices. Current projection techniques allow resolutions below 0.1 μm. Diagrammatically shown in FIG. 1 (designated at 10) is a generic photolithographic projection system in which the various embodiments of the invention may be incorporated. While simplified, system 10 is shown in sufficient detail to provide an understanding of how the embodiments of the invention can provide information about critical dimensional relationships in system 10 as it is employed to fabricate semiconductor devices. As seen in FIG. 1, system 10 is a projection type imaging system having as its major components a wafer stage 12, a mask stage 14, an objective lens 16 in the intervening space between wafer stage 12 and mask stage 14, and an illumination system comprising a source 18 and condenser 15.

Wafer stage 12 is equipped for holding a wafer 20, and in some cases is provided with a shuttle transport arrangement for handling multiple wafers. Formed on wafer 20 is a relief pattern 22 comprising chips having features typically below 0.1 μm. Relief pattern 22 is formed on wafer 20 by forming multiple images of one or more masks 24 carried on mask stage 14, and this is done at a demagnification of between 4 and 5×. Thus, it desirable to move the mask stage at slew rates that match the rates at which wafer image is changing. In this connection, mask stage 24 may be moved in and out of a park position located in the illumination provided by the illumination system while the wafer stage is stationary or may be scanned across the mask stage plane while the wafer stage is synchronously moved in a scanning system.

The optical configuration for objective 16 most closely resembles a microscope system which allows for the formation of aerial images of diffraction-limited resolution at high numerical apertures. The illumination system typically focuses an image of the source into the entrance pupil of the objective lens to provide maximum uniformity at the mask plane. The x and y positions of the wafer and mask stages, along with their angular relationships with respect to global coordinates and each other are measured with well-known interferometers (not shown) but may be of the type shown and described In, for example, "Differential Interferometer Arrangements for Distance and Angle Measurements: Principles, Advantages, and Applications, C. Zanoni, VDI Berichte NR. 749, (1989) or may be dynamic type interferometers of the type shown and described in, for example, PCT Application No. PCT/US00/12097, filed May 5, 2000, and entitled "Interferometry Systems Having a Dynamic Beam-Steering Assembly For Measuring Angle and Distance "by Henry A. Hill and published on Nov. 19, 2000 as WO 00/66969.

In this connection, interferometer 25 is used to monitor the motion of mask stage 14 by generating a measurement beam 34 that detects the position of an object mirror 27 placed on stage 14. Interferometer 26 is provided to monitor the motion of wafer stage 12 via a measurement beam 32 and stage mirror 28. Interferometers 25 and 26 have output signals indicative of the positions of stages 14 and 12, respectively, and these signals are fed to a computer 31 or equivalent microprocessor to perform calculations, issue control signals and perform overall housekeeping functions.

Apart from the motion of the stages, the remainder of the major components of system are typically held in a rigid metrology or space frame 11 (shown in phantom) that is thermally stable and mechanically isolated from otherwise moveable components whose positions and movements need to be precisely controlled. Metrology frame 11 serves also to support the various components including the x and y translation stages. In addition to the location and movement of the mask and wafer stages with respect to one another and the imaging system, it is also desired to maximize the slew rates at which stages 12 and 14 may operate and to control their motion and position relative to one another.

Interferometers 25 and 26 may utilize heterodyne interferometry that utilizes a source with a low split frequency of about 3.0 Mhz. This ordinarily would limit the slew rates at which they could operate. For example, with a double pass system, the Doppler frequency shift would be 3.0 Mhz for a slew rate of 0.5 m/s and thus would limit the slew rates to about 0.5 m/s. The object of the present invention is to be able to increase the slew rates of the reticle and wafer stages irrespective of whether the respective slew rates are greater than or comparable to the corresponding split frequency. One alternative is to operate at the higher rates by increasing the split frequency of the source. However, In certain end use applications, it is preferable to operate at low split frequencies, split frequencies that are lower than the Doppler shift frequencies. This may be accomplished by generating an electronic interference signal (heterodyne or superheterodyne) which will monitor the difference at which the stages are moving. If it is desired that they move with a harmonic relationship, the signal can be arranged so that the differences in Doppler shift frequencies essentially add up to zero when the stages are moving with the harmonic relationship. Therefore, that difference in frequency will be much less than the split frequencies and therefore the lower split frequencies can be used. That the two stages are moving at relatively high speeds is not as important as how they are moving relative to each other. In other words, the information about their relative speeds is used to generate an error signal to feed back a correction so that they move at preselected relative rates. And so, we don't really care that they are moving fast but we do care about relationships of one with respect to the other.

Figure 2:
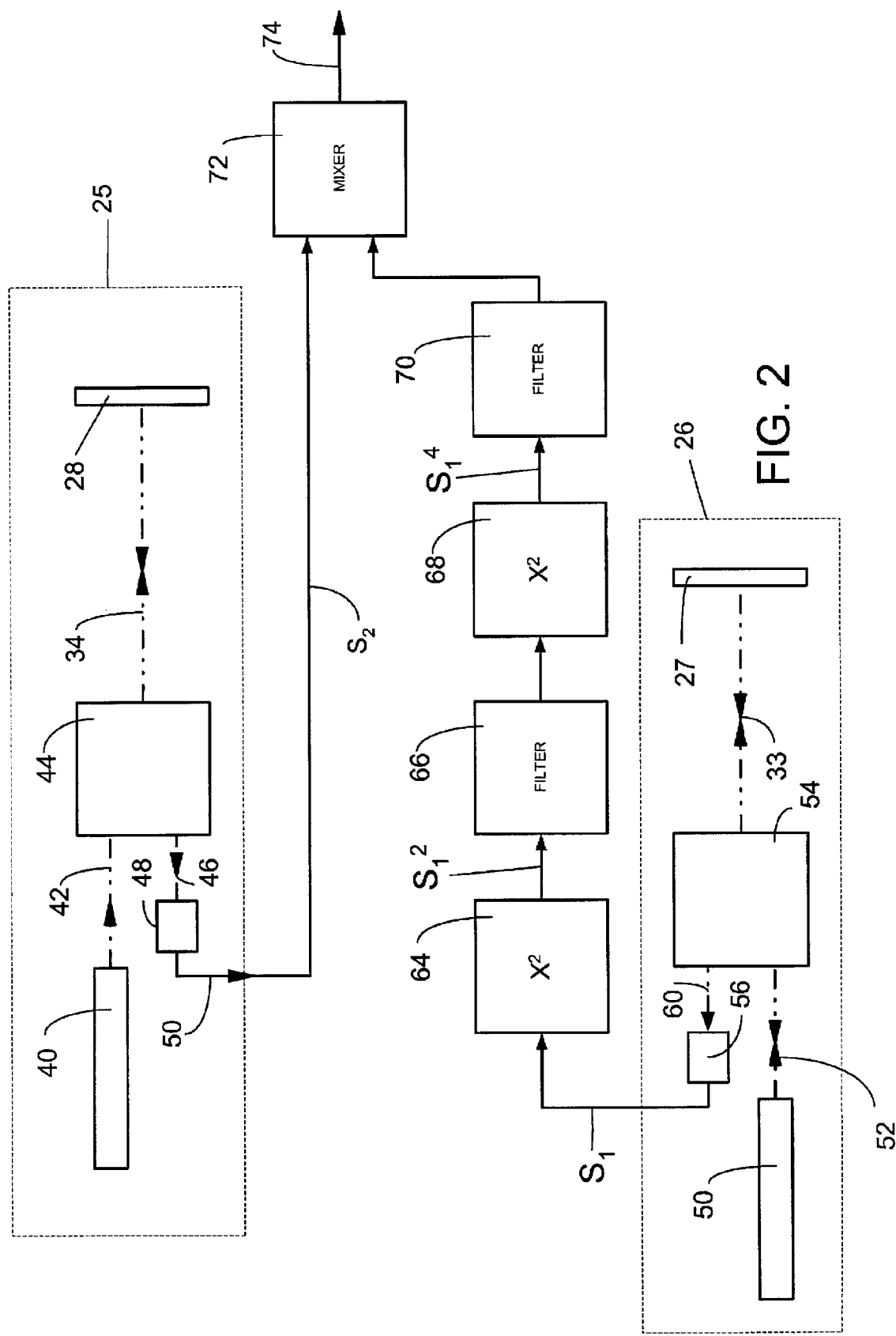
FIG. 2 is block diagram of a system that may be used in the system of FIG. 1 to electronically compensate for Doppler shifts between wafer and reticle stages operating at different and/or higher slew rates.
Figure 3:
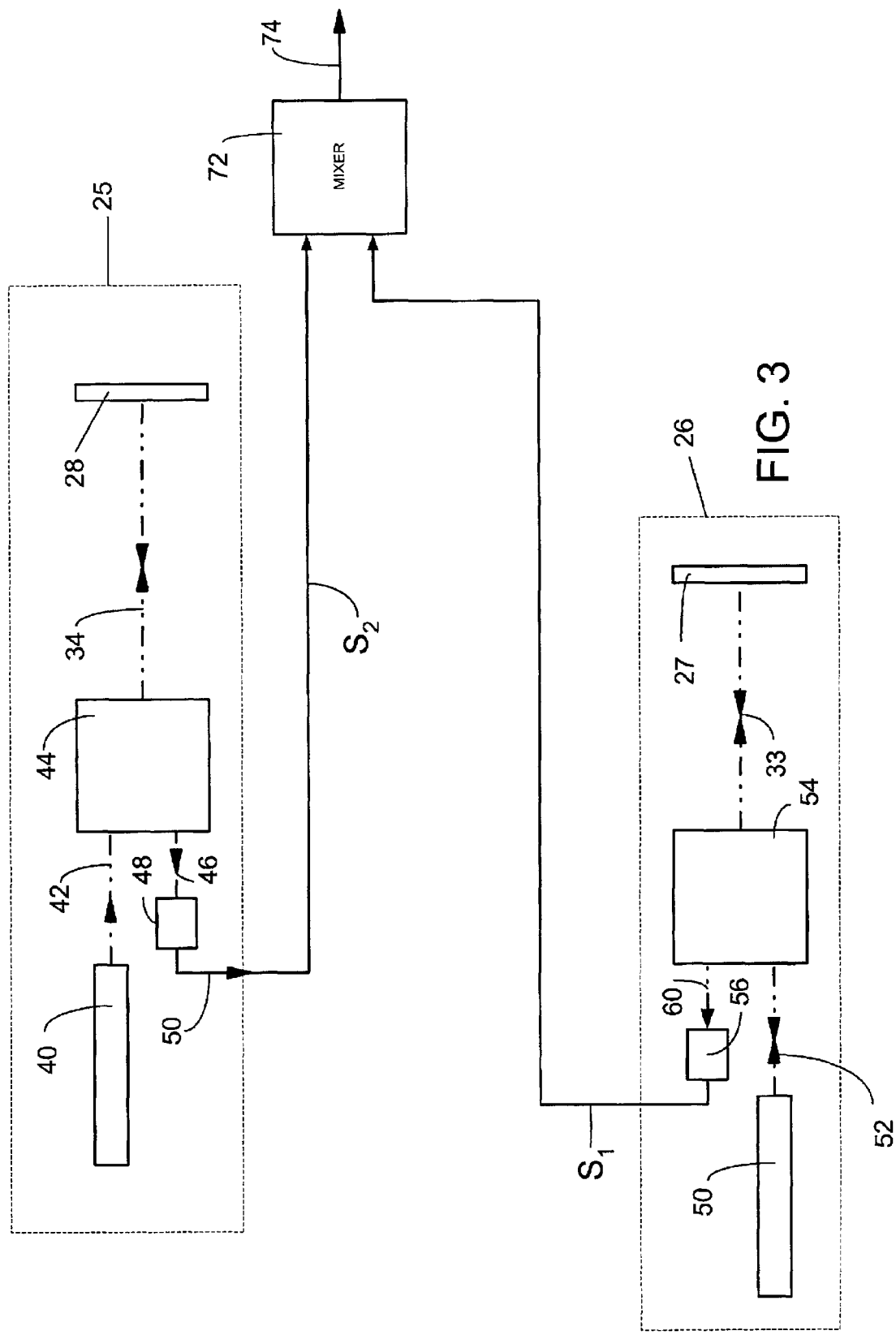
FIG. 3 is block diagram of a system that may be used in the system of FIG. 1 to optically compensate for Doppler shifts between wafer and reticle stages operating at different and/or higher slew rates.

This may be accomplished with one of two embodiments—one which utilizes an electronic scheme as illustrated in FIG. 2 and one that utilizes an optical scheme as illustrated in FIG. 3.

Referring now to FIG. 1, reticle or mask stage interferometer 25 is seen to include a source 40 with an output wavelength $\lambda_1$ and a split frequency $f_2$ that generates an input beam 42. Input beam 42 enters optical module 44 that splits it into a reference beam component (not shown) and a measurement beam component 34 that travels to and from stage mirror 28. Measurement beam component 34 is recombined with the reference beam component of beam 42 as a mixed optical output beam 46. Optical beam 46 is converted to an electrical signal $S_2$ that is fed to mixer 72.

Wafer stage interferometer 26 is seen to comprise a source 50 also having a wavelength $\lambda_1$ but a split frequency $f_1$. Source 50 generates an output beam 52 that is received by optical module 54 which splits it into a reference component (not shown) and a measurement beam component 33 that travels to and from wafer stage mirror 27. The reference and measurement beam components are recombined as a mixed optical output beam 60 that is converted to an electrical signal $S_1$. Signal $S_1$ is sent through a multiplier 64 where it is squared to emerge as $S_1^2$ after which it passes through filter 66 and then on to a second multiplier 68 that again is configured to square its input. The output of multiplier 68 is signal $S_1^4$. $S_1^4$ is filtered and then passes to mixer 72 where it is multiplied with signal $S_2$ to emerge as a superheterodyne signal 74. Subsequent processing of signal 74 takes place in accordance with the teachings and disclosure set forth in U.S. patent application Ser. No. 09/252,266 filed on Feb. 18, 1999 in the names of Peter J. de Groot, et al. and entitled "Interferometer And Method For Measuring The Refractive Index And Optical Path Length Effects Of Air", now U.S. Pat. No. 6,327,039 issued on Dec. 4, 2001 the entire contents of which are incorporated herein by reference.

It is preferable that the Nyquist frequencies of the digital processing of signals $S_1$ and $S_2$ be much larger than the corresponding split frequencies and Doppler shift frequencies. Filters 66 and 68 are high pass filters that remove the components of the squared signals $S_1^2$ and $S_1^4$ having nominal zero frequencies.

With the foregoing processing, the rate of change of the wafer stage is ¼ that of the mask so that the Doppler shifts in signal 74 are subtracted one from the other in accordance with the following: $(4f_1-f_2)+(4\vartheta_{D_1}-\vartheta_{D_2})$ where $\vartheta_D$ is the Doppler frequency shift. The split frequencies $f_1$ and $f_2$ are selected such that $|4f_1-f_2|>|4\vartheta_{D_1}-\vartheta_{D_2}|$ for an end use application. Thus, the cited limitation of a low split frequency is eliminated and the frequency difference $(4\vartheta_{D_1}-\vartheta_{D_2})$ can be measured and used to generate an error signal for the control of the relative slew rates of the wafer and reticle stages to match the preselected rates, e.g. ¼ in a harmonic relationship.

It is fundamental to recognize that that stages may be moving at 1 to 1 instead of 4 to 1, in which case one would not have to multiple the phase, i.e., wouldn't have to go through squaring circuits. Instead, one would just go straight to mixer 72 with the two signals and substract the Doppler shifts in a ¹⁄₁ relationship.

Reference is now made to FIG. 3, which utilizes an optical arrangement to achieve reduction of Doppler shifts while a high sensitivity to a difference in relative Doppler shifts is maintained. Here, components that appeared in FIG. 2 are similarly identified. However, there is a fundamental difference between the embodiments of these two figures, and it resides in the number of passes that the beams of their respective systems make to their respective object mirrors. In the embodiment of FIG. 2, the measurement beams of interferometer systems 25 and 26 made the same number of passes whereas in the embodiment of FIG. 3, the number of passes differs to reduce the Doppler shifts which $=(f_1-f_2)+(\vartheta_{D_1}-\vartheta_{D_2})$. The split frequencies $f_1$ and $f_2$ are selected such that $|f_1-f_2|>|\vartheta_{D_1}-\vartheta_{D_2}|$ for an end use application. Thus the cited limitation of a low split frequency is eliminated and the frequency difference $(\vartheta_{D_1}-\vartheta_{D_2})$ can be measured and used to generate an error signal for the control of the relative slew rates of the wafer and reticle stages in a harmonic relationship, e.g. ¼. Here, also superheterodyne output signal 74 is subsequently processed in the manner set forth in U.S. patent application Ser. No. 09/252,440 filed on Feb. 18, 1999 in the names of Henry Allen Hill, et al. and entitled "Apparatus And Method For Measuring The Refractive Index And Optical Path Length Effects Of Air Using Mutiple-Pass Interferometry", now U.S. Pat. No. 6,219,144 issued on Apr. 17, 2001 the entire contents of which are incorporated herein by reference.

Two examples of double pass and four pass interferometers are described in the commonly owned U.S. Provisional Application No. 60/314,568 filed on Aug. 23, 2001, published as U.S. 20030048456 on Mar. 13, 2003 and entitled "Zero Shear Plane Mirror Interferometer" and U.S. Provisional Application No. 60/314,569 filed on Aug. 23, 2001 published as U.S. 20030053079 on Mar. 20, 2003, and entitled "Zero Shear Non-Plane Mirror Interferometers," respectively, both by Henry A. Hill the contents of which are included in their entirety by reference. Other multiple pass interferometers are described for example in the cited article by Zanoni.

It will be evident to one skilled in the art that an odd multiplier of a Doppler shift frequency such as 5 can be achieved by electronically multiplying $S_1^4$ by $S_1$ without departing from the scope and spirit of the present invention.

It will also be evident to one skilled in the art that the electronic and optical procedures of the first and second embodiments can be combined to achieve a desired Doppler shift frequency in relation to a particular speed of a stage without departing from the scope and spirit of the present invention. For example the electrical interference signal of a double pass interferometer can be squared to produce a multiplier of 4 relative to the Doppler shift frequency of a single pass interferometer.

Having described the various embodiments, it will be obvious to those skilled in the relevant art how to make additional changes based on the teachings of the invention and all such changes are intended to be within the scope of the invention.

What is claimed is:

1. Interferometric apparatus for monitoring the relative motion among objects, said apparatus comprising:

a plurality of interferometers for monitoring the motion of objects, each of said plurlity of interferometers operating to provide a mixed optical interference signal containing phase information indicative of the motion of a corresponding object;

detector means for receiving said first mixed optical interference signal and generating electrical interference signal containing information corresponding to the motion of each object;

electronic processing means for receiving at least one select one said electrical interference signal and generating a corresponding modified electrical interference signal that is compensated for any Doppler shift differences among said electrical interference signals caused by differences in preselected relative rates of motion in said object; and electronic mixing means for receiving said electrical interference signal and said modified electrical interference signal and generating an output electrical interference signal containing information about the relative motion between object.

2. Interferometric apparatus for monitoring the relative motion among objects, said apparatus comprising:

a plurality of interferometers for monitoring the motion of objects, each of said plurality of interferometers having a measurement beam that travels over a predetermined optical path and operating to provide a mixed optical interference signal containing phase information indicative of the motion of a corresponding object, the measurement beam of at least one of said interferometers traveling over its corresponding predetermined optical path over a different number of passes than that traveled by said measurement beams of said other interferometers to compensate for any Doppler shift differences among said mixed optical interference signals caused by differences in preselected relative rates of motion between said objects;

detector means for receiving said first mixed optical interference signal and generating electrical interference signal containing information corresponding to the motion of each object;

electronic mixing means for receiving said electrical interference signals and said modified electrical interference signal and generating an output electrical interference signal containing, information about the relative motion between objects.

3. Interferometric apparatus for monitoring the relative motion among objects, said apparatus comprising:

a first interferometer for providing a first mixed optical interference signal containing phase information indicative of the motion of a first object;

first detector means for receiving said first mixed optical interference signal and generating a first electrical interference signal containing information corresponding to the motion of said first object;

at least one other interferometer for providing another mixed optical interference signal containing phase information indicative of the motion of another object;

at least one other detector means for receiving said other mixed optical interference signal and generating another electrical interference signal containing information corresponding to motion of said other object;

electronic processing means for receiving said other electrical interference signal and generating a modified electrical interference signal that is compensated for any Doppler shift differences in said first and other electrical interference signals caused by differences in preselected relative rates of motion in said first and other object; and electronic mixing means for receiving said first electrical interference signal and said modified electrical interference signal and generating an output electrical interference signal containing information about the relative motion between said first and other object.

4. The interferometric apparatus of claim 3 wherein said electronic processing means is configured and arranged to multiply the phase of said other electrical interference signal by a multiplier corresponding to the ratio of the preselected relative rates of motion of said first and other object to generate said modified electrical interference signal.

5. The interferometric apparatus of claim 3 wherein first object comprises a photolithographic reticle stage with a first rate of motion and wherein said other object comprises a photolithographic wafer stage having another rate of motion no faster than that of said first rate of motion.

6. The interferometric apparatus of claim 3 wherein said first interferometer comprises a source having a split frequency of $f_2$ and a Doppler frequency shift of $\vartheta_{D_2}$, wherein said other interferometer comprises a source having a split frequency of $f_1$ and a Doppler frequency shift of $\vartheta_{D_1}$, wherein the ratio of said preselected relative rate of motion of said first object to said other object is 1/n, and wherein said differences in Doppler shifts caused by differences in said preselected relative rates of motion are compensated in accordance with the following:

$(nf_1-f_2)+(n\vartheta_{D_1}-\vartheta_{D_2})$ where $|nf_1-f_2|>|n\vartheta_{D_1}-\vartheta_{D_2}|$.

7. The interferometric apparatus of claim 6 wherein n is an integer having a value over the range including 1 and at least 4.

8. The interferometric apparatus of claim 3 wherein said first, other, and modified electrical interference signals comprise heterodyne signals.

9. The interferometric apparatus of claim 8 wherein said electronic mixing means is configured to multiply said first and said modified heterodyne electrical interference signals to generate said output signal as a superheterodyne signal.

10. Interferometric apparatus for monitoring the relative motion among objects, said apparatus comprising:

a first interferometer having a measurement beam that travels over a predetermined optical path for providing a first mixed optical interference signal containing phase information indicative of the motion of a first object;

first detector means for receiving said first mixed optical interference signal and generating a first electrical interference signal containing information corresponding to the motion of said first object;

at least one other interferometer having a measurement beam that travels over a predetermined optical path a different number of passes than that traveled by said measurement beam of said first interferometer for providing another mixed optical interference signal containing phase information indicative of the motion of another object, said other mixed optical interference signal compensating for any Doppler shift differences in said first and other mixed optical interference signals caused by differences in preselected relative rates of motion of said first and other object;

at least one other detector means for receiving said other mixed optical interference signal and generating another electrical interference signal containing information corresponding to motion of said other object; and electronic mixing means for receiving said first electrical interference signal and said other electrical interference signal and generating an output electrical interference signal containing information about the relative motion between said first and other object.

11. The interferometric apparatus of claim 10 wherein first object comprises a photolithographic reticle stage with a first rate of motion and wherein said other object comprises a photolithographic wafer stage having another rate of motion no faster than that of said first rate of motion.

12. The interferometric apparatus of claim 10 wherein said first interferometer comprises a source having a split frequency of $f_2$ and a Doppler frequency shift of $\vartheta_{D_2}$, wherein said other interferometer comprises a source having a split frequency of $f_1$ and a Doppler frequency shift of $\vartheta_{D_1}$, and wherein differences in said Doppler shifts caused by differences in the preselected relative rates of motion are compensated in accordance with the following:

$(f_1-f_2)+(\vartheta_{D_1}-\vartheta_{D_2})$ where $|f_1-f_2|>|\vartheta_{D_1}-\vartheta_{D_1}|$.

13. The interferometric apparatus of claim 10 wherein the ratio of the rate of motion of said first object to said other object is 1/n where n is an integer having a value between the range including 1 and at least 4.

14. The interferometric apparatus of claim 10 wherein the ratio of the number of passes of the respective measurement beams of said first and other interferometer corresponds to the ratio of their respective preferred rates of motion.

15. The interferometric apparatus of claim 10 wherein said first and other, electrical interference signals comprise heterodyne signals.

16. The interferometric apparatus of claim 15 wherein said output electrical interference signal comprises a superheterodyne signal.

* * * * *